United States Patent [19]

Chen

[11] Patent Number: 6,093,629
[45] Date of Patent: Jul. 25, 2000

[54] METHOD OF SIMPLIFIED CONTACT ETCHING AND ION IMPLANTATION FOR CMOS TECHNOLOGY

[75] Inventor: Sen-Fu Chen, Taipei, Taiwan

[73] Assignee: Taiwan Semiconductor Manufacturing Company, Hsin-Chu, Taiwan

[21] Appl. No.: 09/017,566

[22] Filed: Feb. 2, 1998

[51] Int. Cl.[7] .................................................. H01L 21/44
[52] U.S. Cl. .......................... 438/597; 438/199; 438/233; 438/598; 438/618; 438/621; 438/622; 438/586; 438/637
[58] Field of Search .................................. 438/597, 618, 438/622, 620, 621, 586, 587, 637, 598, 675, 672, 199, 233

[56] References Cited

U.S. PATENT DOCUMENTS

| | | | |
|---|---|---|---|
| 4,512,073 | 4/1985 | Hsu | 29/571 |
| 5,154,946 | 10/1992 | Zdebel | 437/34 |
| 5,292,677 | 3/1994 | Dennison | 437/52 |
| 5,460,993 | 10/1995 | Hsu et al. | 437/44 |
| 5,554,565 | 9/1996 | Liaw et al. | 438/629 |
| 5,573,969 | 11/1996 | Kim | 437/57 |
| 5,700,717 | 12/1997 | Nowak et al. | 438/629 |
| 5,705,442 | 1/1998 | Yen et al. | 438/653 |
| 5,718,800 | 2/1998 | Juengling | 438/200 |

*Primary Examiner*—John F. Niebling
*Assistant Examiner*—Lynn Gurley
*Attorney, Agent, or Firm*—George O. Saile; Stephen B. Ackerman

[57] ABSTRACT

A method for forming n- and p-type contacts for CMOS integrated circuits is described wherein the contact openings are ion implanted after being etched to provide supplemental doping to the exposed device elements in order to secure a reliable low resistance interface with subsequently deposited contact metallurgy The p-type contact openings and the n-type contact openings are patterned, etched, and ion implanted separately, thereby requiring only two photolithographic steps. By etching and implanting the p-contacts and n-contacts separately, the method eliminates one highly complex and contaminative photolithographic step and introduces a less complex etch step with reduced contamination risk, thereby achieving a cost saving by improving yield and reducing process time. It is optional which contacts are processed first.

15 Claims, 6 Drawing Sheets

METHOD OF SIMPLIFIED CONTACT ETCHING AND ION IMPLANTATION FOR CMOS TECHNOLOGY

BACKGROUND OF THE INVENTION (1) Field of the Invention

The invention relates to processes for the manufacture of semiconductor devices and more particularly to processes for forming contact to field effect transistors in CMOS integrated circuits.

(2) Description of Prior Art and Background to the Invention

Complimentary metal oxide semiconductor(CMOS) field effect transistor(FET) technology involves the formation n-channel FETs(NMOS) and p-channel FETs(PMOS) in combination to form low current, high performance integrated circuits. The use of complimentary NMOS and PMOS devices, typically in the form of a basic inverter device, allows a considerable increase of circuit density of circuit elements by reduction of heat generation. The increase in device density accompanied by the shrinkage of device size has resulted in improved circuit performance and reliability as well as reduced cost. For these reasons CMOS integrated circuits have found widespread use, particularly in digital applications.

A number of ion implantation process steps are required to form MOSFET devices and because the PMOS devices require a p-type dopant ion implant where the NMOS devices require an n-type dopant, twice the number of implantation steps are typically required to concurrently form the two device types. The conventional procedure for an implantation operation is to mask the regions of one device type while the corresponding regions of the other type are implanted. The first mask is then stripped and another mask is applied over the just implanted devices while the devices of the first type receive the implantation.

The photoresist masks used to protect devices of one type while devices of the other type are implanted are often referred to as "block out" masks. They may be distinguished from other photoresist masks used in integrated circuit processing by the fact that they do not require as precise an alignment procedure as the other masks. Block out masks are also used to mask features of one type device while processing the other type. Hsu, et.al., U.S. Pat. No. 5,460, 993 apply a block out mask to NMOS device sidewalls while PMOS device sidewalls are etched to make them narrower.

In a prior art process for forming contacts to the elements of CMOS semiconductive devices, an interlevel dielectric (ILD) layer is deposited over the devices. The ILD layer is first planarized and then a photoresist layer is applied. Contact openings are patterned in a photoresist layer for both the PMOS and NMOS devices.

Openings are formed in the ILD layer by anisotropic etching. After the contact openings are formed, the exposed conductive material at the base of the contact openings is provided with a supplemental ion implant prior to the deposition of contact material, for example tungsten plugs, The supplemental ion implant is required to reinforce the dopant concentration of the silicon at the base of the contact openings in order to assure a reliable low resistance ohmic contact. This is done by means of a shallow ion implant into the contact openings. Since both n- and p-type contacts in the CMOS integrated circuit have been opened by the contact etch, it is necessary to apply a block out photoresist mask to cover the p-contact openings while the n-contacts are implanted. After the n-contact implant, the p-contact block out mask is stripped and an n-contact block out mask is applied and patterned to protect the n-contacts during the p-contact ion implant. The overall process sequence requires three photolithographic steps entailing an all-contact mask and two block out masks. The sequence of steps in the prior art process are shown on the left side of FIG. 6. The three photo steps are marked with an asterisk.

One of the most handling intensive and complex processing procedures in integrated circuit manufacturing is photolithographic patterning. This procedure involves a great deal of wafer manipulation and exposure of wafers to environments which subject them to particulate contamination. A photoresist coating is first applied by spinning the wafer on a chuck and delivering the liquid photoresist through a nozzle. The photoresist film is then cured by baking, often by a several treatments at different temperatures. Next the wafer is mounted in an exposure apparatus, typically a stepper, and is mechanically stepped under a system of optics whereby each integrated circuit die is exposed to a reticle pattern. Finally, the wafer is passed though a sequence of photo development solutions to develop the mask image. Because of the great impact of photolithography on product yield. It is a goal of the process designer to necessitate as few photolithographic steps as possible.

A method of modifying a process to reduce the number of photomask steps is illustrated by Dennison, U.S. Pat. No. 5,292,677 wherein a combination of an etch stop layer and a critical partial etch permits the definition of three essentially different contacts by a single photomask step.

SUMMARY OF THE INVENTION

It is an object of this invention to provide a method for forming contact openings to CMOS devices and providing a contact ion implant into the bases of both the NMOS and PMOS contact openings by a using only two photolithographic steps.

It is another object of this invention to reduce exposure of a CMOS integrated circuit to particulate contamination during the processing of device contacts.

It is yet another object of this invention to improve the yield of CMOS integrated circuits.

It is yet another object of this invention to reduce the number of photolithographic steps used in the formation of CMOS integrated circuits.

It is yet another object of this invention to perform supplemental contact dopant ion implantation without incurring risk of photoresist residues in at least one set of contact openings.

These objects are accomplished by defining, etching, and ion implanting the PMOS contacts with a first photomask step and defining, etching, and ion implanting the NMOS devices with a second photomask step. Thus the same photoresist mask is used for both etching the opening and ion implanting the contact. It is optional which type of contacts is processed first. The second set processed will have the added benefit of averting photoresist or photoresist residues in the contact openings.

The process eliminates one highly complex and contaminative photolithographic step and introduces a less complex etch step with reduced contamination risk, thereby achieving a cost saving by improving yield and reducing process time.

DESCRIPTION OF THE PREFERRED EMBODIMENTS

Figure 1:
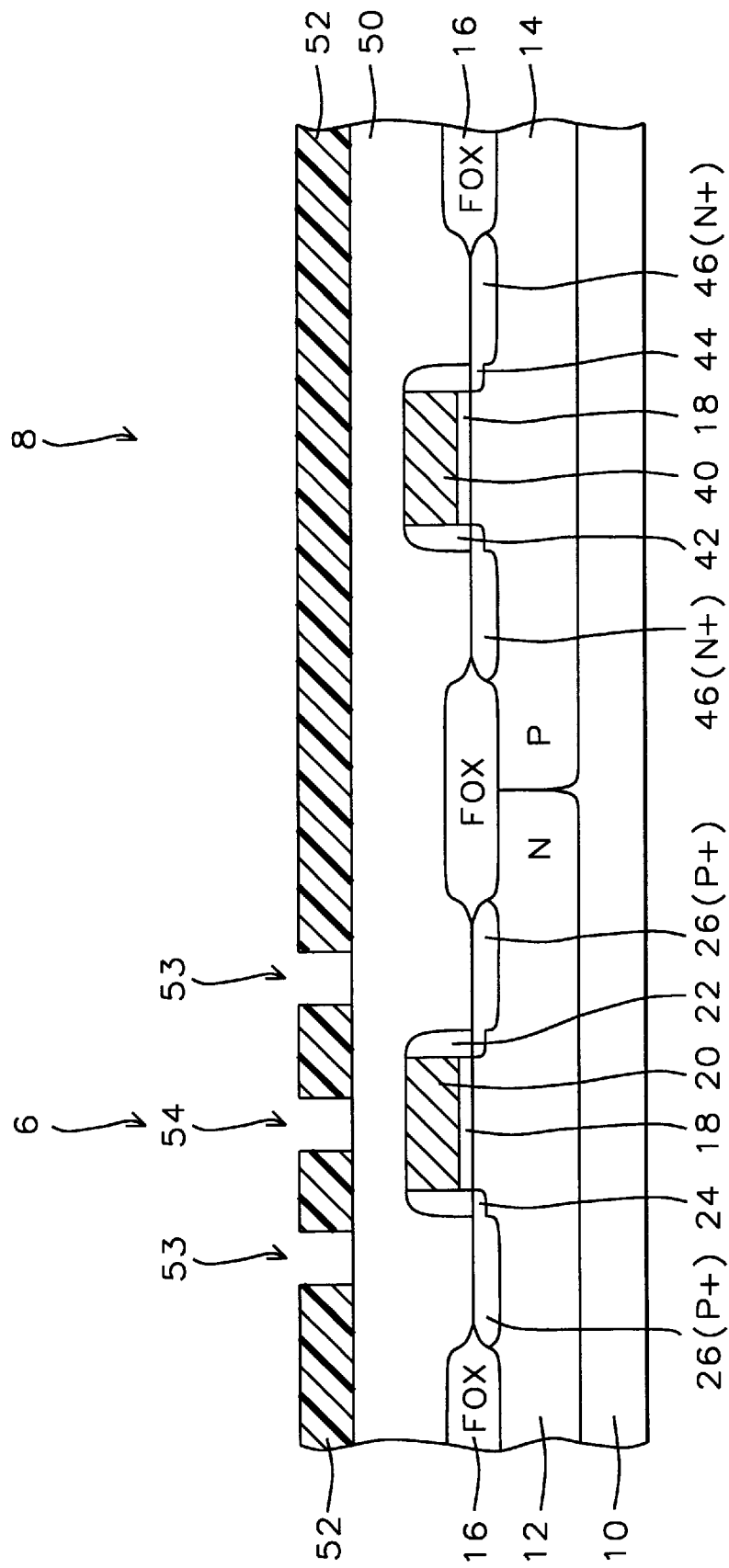
FIG. 1 through FIG. 5 are cross sections of a CMOS structure having self-aligned polysilicon gate MOSFETs showing the sequence of process steps taught by this invention

In a preferred embodiment of this invention a p-type monocrystalline silicon wafer is provided. Referring to FIG. 1, the wafer 10 is processed using well know twin-tub CMOS technology to a point in the processing where an PMOS device 6 and an NMOS device 8 have been formed within its surface and isolated by a field oxide 16. A gate oxide between about 50 and 180 Å thick is formed, preferably by thermal oxidation silicon regions left exposed by the field oxide 16.

Polysilicon gate electrodes 20 and 40 are then formed over the gate oxide 18 by depositing successive layers of undoped and doped polysilicon by low pressure chemical vapor deposition(LPCVD), patterning the layers by conventional photolithographic methods, and anisotropically etching the layers, preferably by reactive ion etching(RIE). Other materials may also be applied to the gate electrode stack to improve its conductivity, for example tungsten silicide.

The PMOS device 6 is formed in the n-well 12 while the NMOS device 8 is formed in the p-well 14. LDD(Lightly doped drain) regions 24, 44 are next formed by ion implantation. In CMOS technology the p-type LDD regions 24 of the PMOS device 6 are ion implanted with boron while the corresponding regions of the NMOS device 8 are protected by a photoresist block out mask. Conversely the n-type LDD regions of the NMOS device 8 are then ion implanted with an n-type dopant, for example arsenic, while the PMOS device 6 is covered by a photoresist block out mask. The order of the two implantation steps may be reversed. The presence of the polysilicon gates 20,40 during the ion implantation cause the LDD ion implantations to be self-aligned to the gate.

Sidewall spacers 22 and 42 are then formed alongside the gate electrodes 20 and 40 respectively by depositing a conformal insulative layer, for example silicon oxide by LPCVD and anisotropically etching the layer back to the silicon. The preferred anisotropic etching technique is RIE. The technique of forming sidewall spacers is well known and widely practiced in the art.

The main source/drain regions 26, 46 are next implanted using the same alternating method for the PMOS and NMOS devices that was used for the LDD implantation. The PMOS source/drain regions 26 are ion implanted with boron while the corresponding regions 46 of the NMOS device 8 are protected by a photoresist block out mask. Conversely the source/drain regions of the NMOS device 8 are ion implanted with an n-type dopant, for example arsenic, while the PMOS device 6 is covered by a photoresist block out mask. These alternating procedures for forming the elements of CMOS devices are well known to those in the art. The doses and energies of the implanted ions are determined according to the design requirements of the devices and are likewise well known to those in the art. The procedure for the formation of the LDD regions and that for forming the main source/drain regions each requires the use of two block out photolithographic steps.

Figure 6:
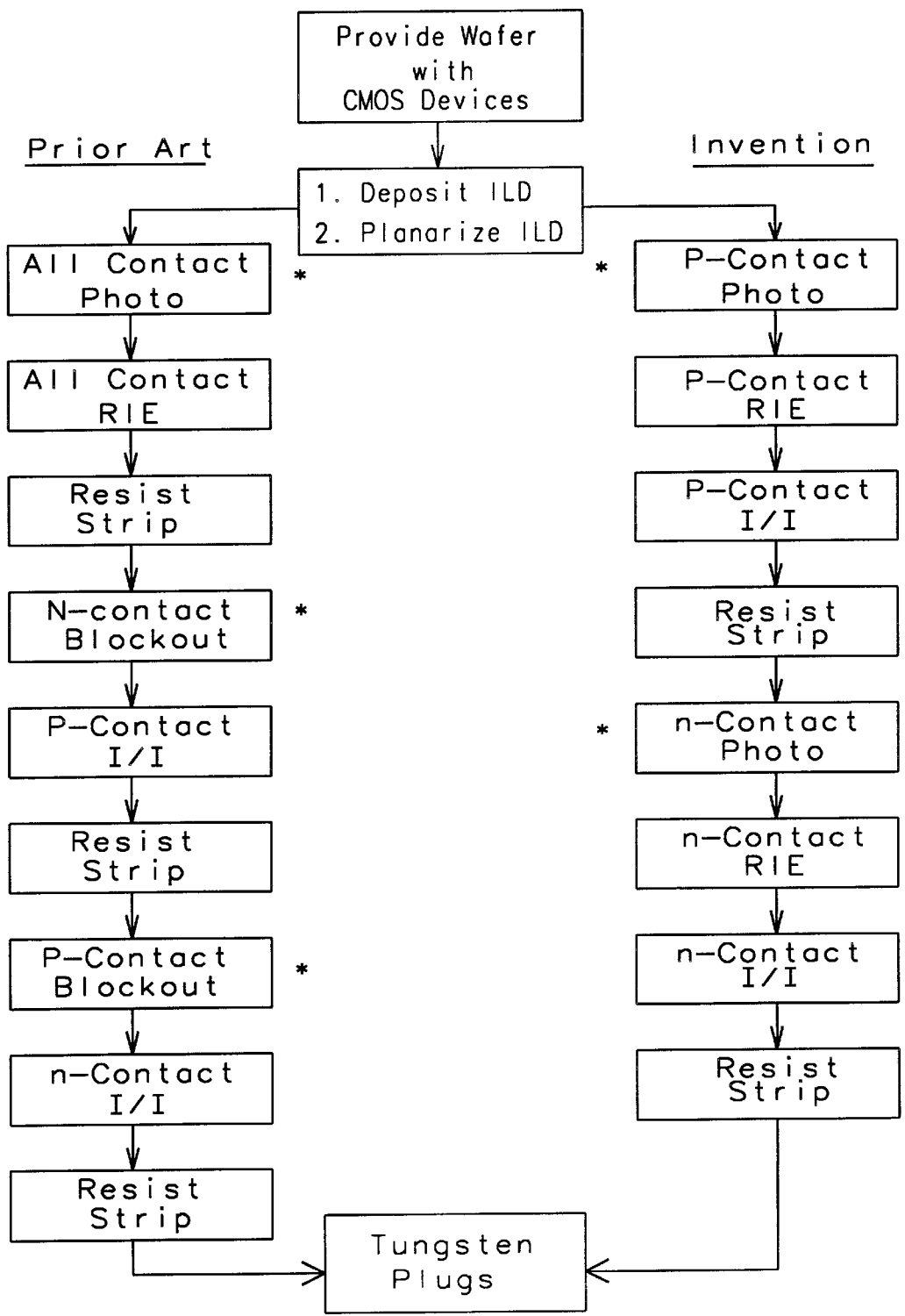
FIG. 6 is a flow chart comparing the sequence of steps for forming contacts in a CMOS integrated circuit by a prior art process and by the process of the current invention.

The processing steps for this embodiment may now also be followed with reference to the flow chart shown by FIG. 6 wherein the process steps of the current invention are compared with those of the prior art.

Processing of the CMOS integrated circuit proceeds with the deposition of an insulative layer 50 over the wafer. This layer 50, is preferably of a flowable glass such as borophosphosilicate glass(BPSG). The Insulative layer 50 is deposited by LPCVD using well established precursors and is thermally flowed to planarized its surface at temperatures between about 700 and 900° C. A layer photoresist layer 52 is deposited over the Insulative layer 50 and patterned to the define p-contact openings 53,54 of the PMOS device 6.

Figure 2:
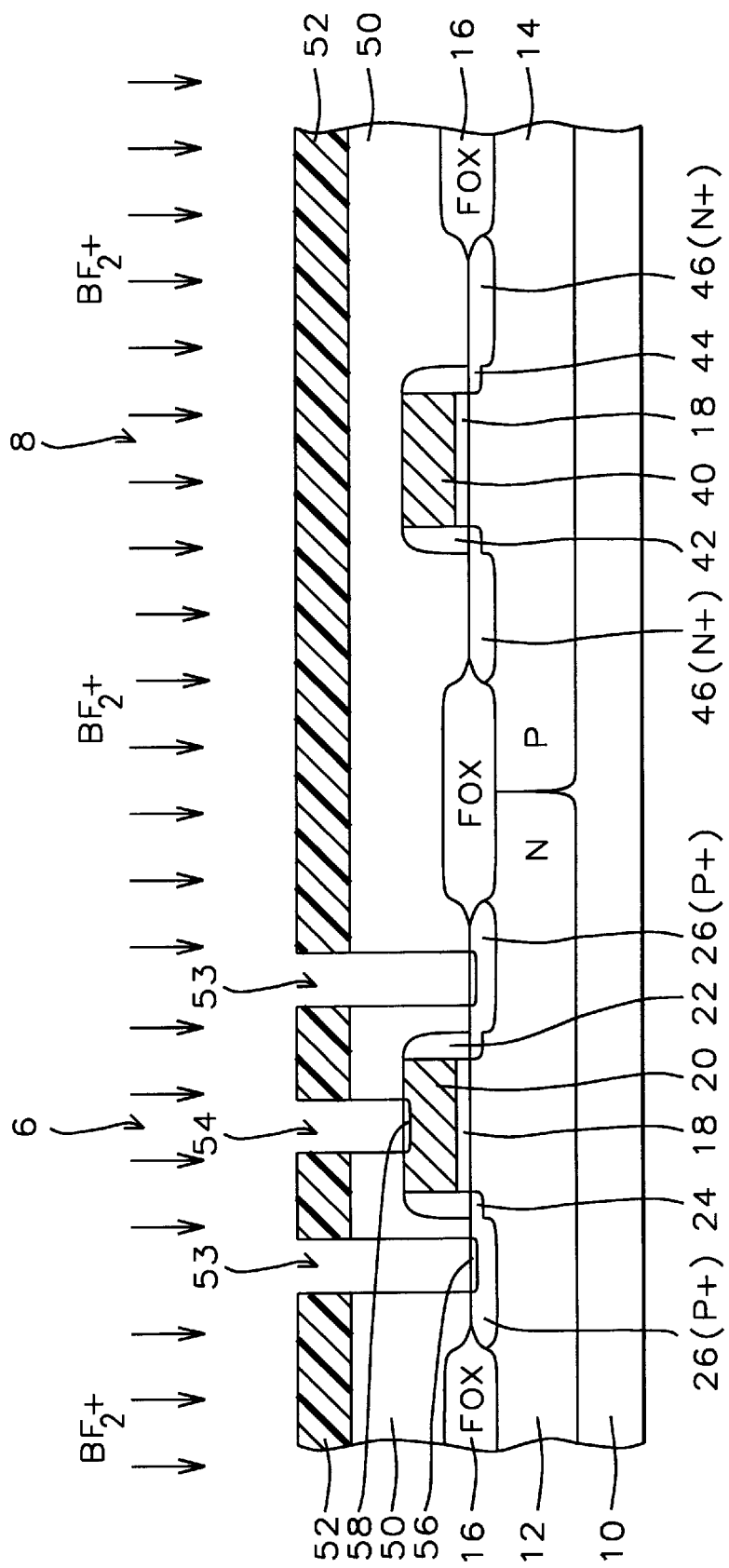

Referring now to FIG. 2, the contact openings themselves 53,54 are formed by RIE using a conventional oxide known etchants with high oxide-to-silicon selectivity, typically a mixture of fluorocarbons. The exposed silicon at the base of the contact openings 53 and gate material at the base of the gate contact opening 54 is then implanted with $BF_2^+$ ions at a dose of between about $2\times10^{14}$ and $2\times10^{15}$ ions/cm² $2\times10^{14}$–$2\times10^{15}$ and at an energy of between about 30 and 100 keV. This shallow implant 56,58 provides sufficient doping in the surface region of the contacts to assure a stable ohmic interface between the device elements and the subsequently formed contact metallization. The photoresist layer 52 is then stripped, preferably by ashing in an oxygen plasma.

Figure 3:
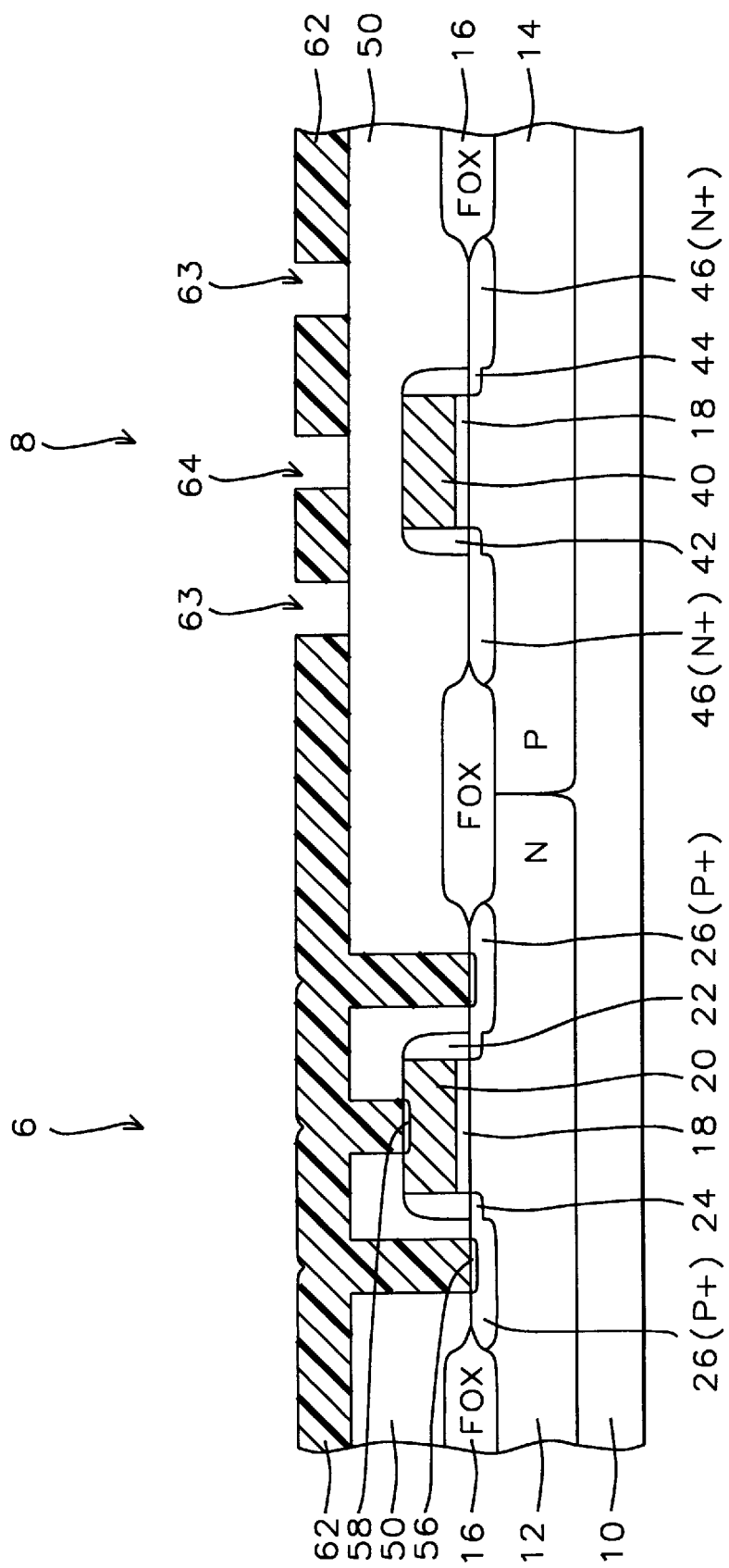

Referring now to FIG. 3 a photoresist layer 62 is deposited over the Insulative layer 50 and patterned to define the n-contact openings 63,64 of the NMOS device 8. The photoresist layer covers the contacts of the PMOS device which have already been implanted, shielding them from the n-type implant.

Figure 4:
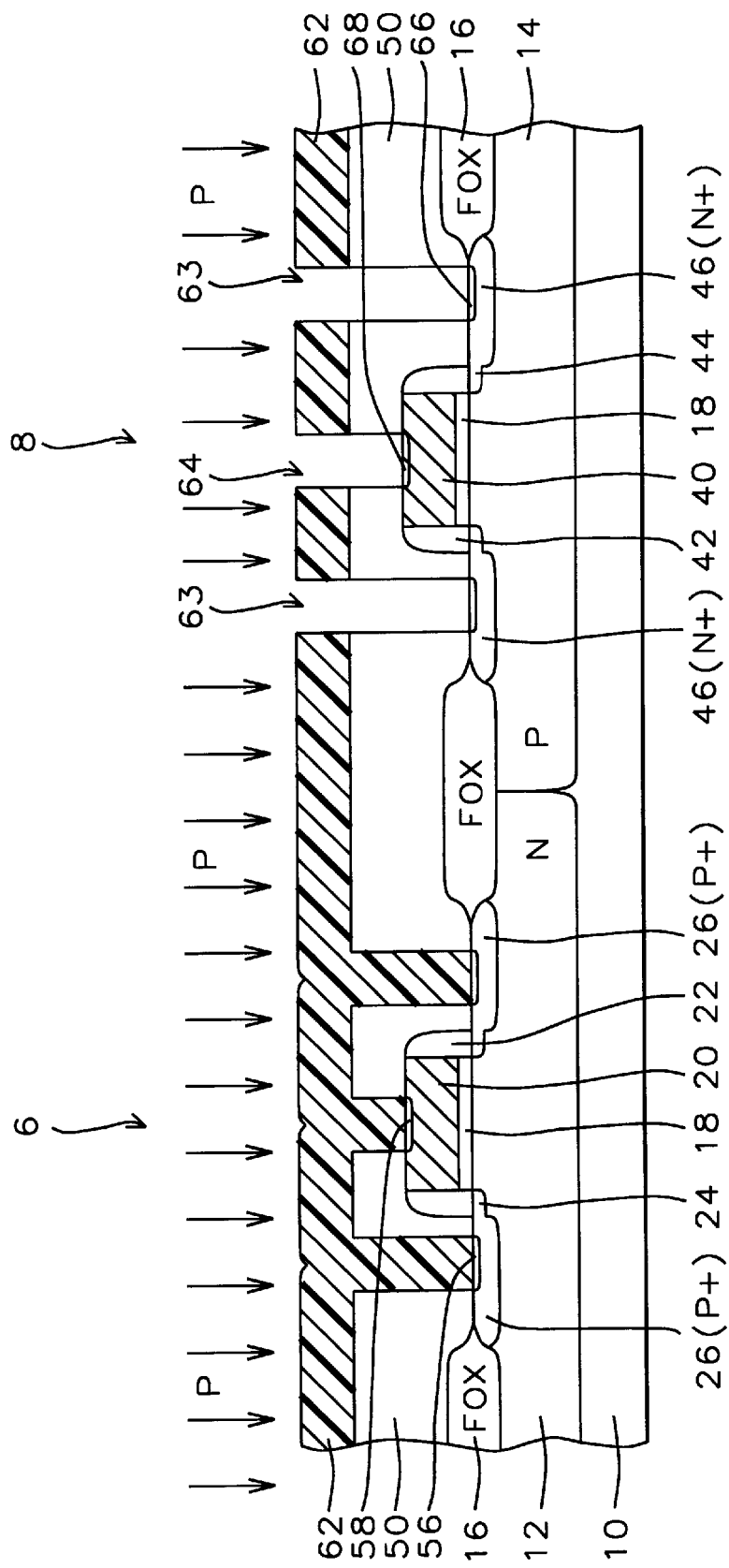

Referring now to FIG. 4, the contact openings themselves 63,64 are formed by RIE using a conventional oxide known etchants with high oxide-to-silicon selectivity, typically a mixture of fluorocarbons. The exposed silicon at the base of the contact openings 63 and gate material at the base of the gate contact opening 64 is then implanted with phosphorous ions at a dose of between about $2\times10^{14}$ and $2\times10^{15}$ ions/cm² and at an energy of between about 30 and 100 keV. This shallow implant provides sufficient doping in the surface region 66,68 of the contacts to assure a stable ohmic interface between the device elements and the subsequently formed contact metallization. Alternatively, arsenic may be implanted into the contact openings. The photoresist layer 62 is then stripped, preferably by ashing in an oxygen plasma.

Figure 5:
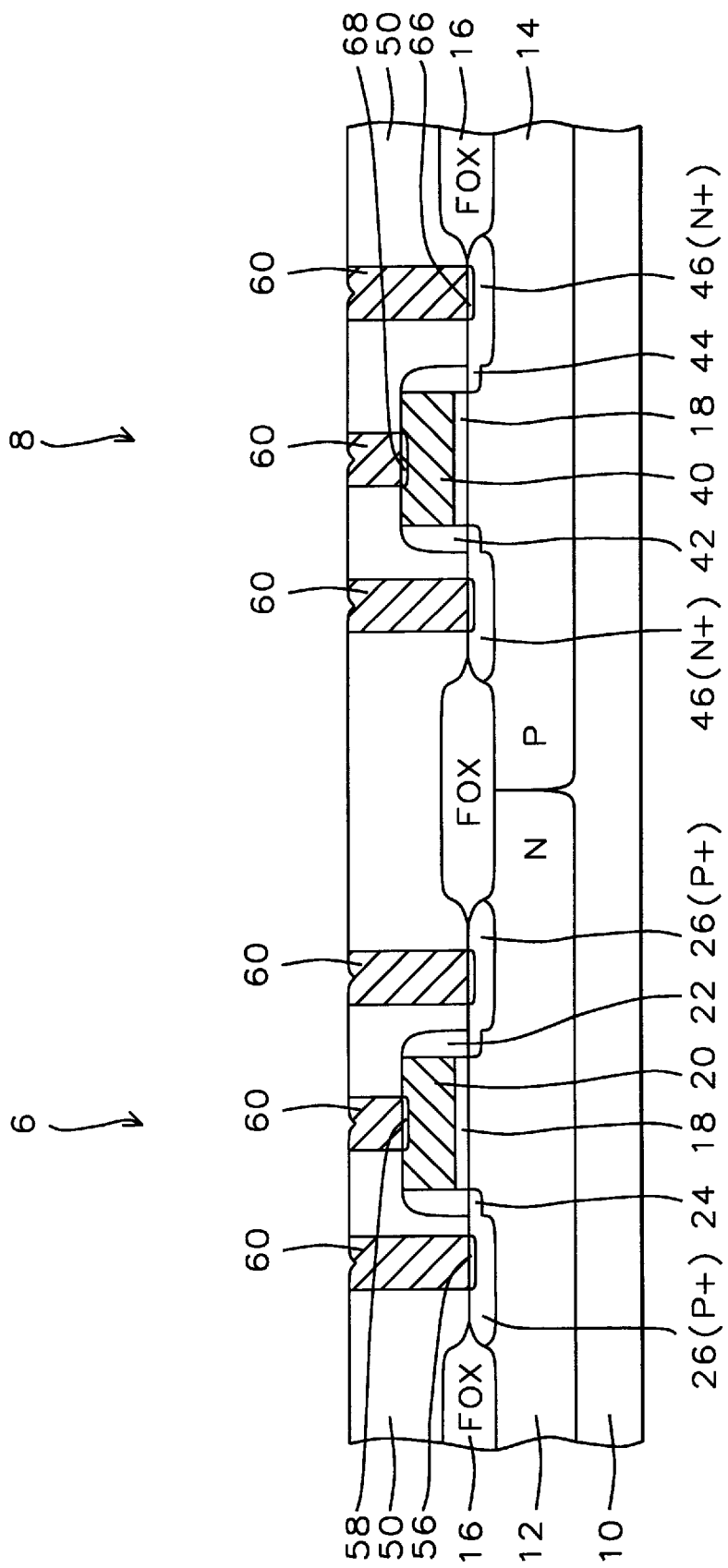

Referring next to FIG. 5, tungsten plugs 60 are formed in the contact openings by methods well known in the art. In a preferred method, an adhesion/barrier metallurgy(not shown), comprising Ti/TiN is first formed over the wafer followed by the deposition of a layer of tungsten by LPCVD. The tungsten layer fills in the openings. Next, the tungsten and Ti/TiN layers are etched back to the surface of the Insulative layer 50, by RIE, leaving the tungsten plugs 60 in the openings. Interconnection wiring, for example aluminum or copper is formed over the Insulative layer 50 by processes well known to those in the art, thereby incorporating the CMOS devices 6,8 into an integrated circuit.

While this invention has been particularly shown and described with reference to the preferred embodiments thereof, it will be understood by those skilled in the art that various changes in form and details may be made without departing from the spirit and scope of the invention.

While the embodiment of this invention utilizes a p-type silicon substrate, an n-type silicon substrate could also be used in which the n-well 12 and the p-well 14 are formed without departing from the concepts therein provided. Similarly, the CMOS structures could be also formed by a single well process.

While in the embodiment the p-type contacts were patterned, etched, and implanted first and the n-type contacts were patterned, etched and implanted second, this sequence may be interchanged without departing from the spirit and scope of the invention. Although the primary processing goals are achieved by either method, secondary considerations might yield preference to one method or the other.

What is claimed is:

1. A method for forming contacts to semiconductive elements on a silicon wafer comprising:
   (a) providing a silicon wafer having n- and p-type semiconductive elements;
   (b) depositing an insulative layer over said semiconductive elements;
   (c) depositing a first photoresist layer on said insulative layer;
   (d) patterning said first photoresist layer to define p-type contacts to said p-type semiconductive elements;
   (e) etching said insulative layer thereby forming p-contact openings;
   (f) implanting p-type impurity into said p-contact openings;
   (g) stripping said first photoresist layer;
   (h) depositing a second photoresist layer on said insulative layer;
   (i) patterning said second photoresist layer to define n-type contacts to said n-type semiconductive elements while covering said p-contact openings;
   (j) etching said insulative layer thereby forming n-contact openings;
   (k) implanting n-type impurity ions into said n-contact openings;
   (l) stripping said second photoresist layer; and
   (m) forming conductive plugs in said n-contact openings and said p-contact openings.

2. The method of claim 1 wherein said insulative layer is a borophosphosilicate glass.

3. The method of claim 1 wherein said p-type impurity ions are $BF_2^+$ ions and are implanted at a dose of between about $2\times10^{14}$ and $2\times10^{15}$ ions/cm$^2$ and at an energy of between about 30 and 100 keV.

4. The method of claim 1 wherein said n-type impurity ions are phosphorous ions and are implanted at a dose of between about $2\times10^{14}$ and $2\times10^{15}$ ions/cm$^2$ and at an energy of between about 30 and 100 keV.

5. method of claim 1 wherein said conductive plugs contacts are tungsten plugs.

6. A method for forming contacts in a CMOS integrated circuit comprising:
   (a) providing a silicon wafer having CMOS devices comprising p-channel MOSFETs and n-channel MOSFETS;
   (b) depositing an insulative layer over said CMOS devices;
   (c) planarizing said insulative layer;
   (d) depositing a first photoresist layer on said insulative layer;
   (e) patterning said first photoresist layer to define p-type contacts to elements of said p-channel MOSFETs;
   (f) etching said insulative layer thereby forming n-contact openings;
   (g) implanting p-type impurity ions into said p-contact openings;
   (h) stripping said first photoresist layer;
   (i) depositing a second photoresist layer on said insulative layer;
   (j) patterning said second photoresist layer to define n-type contacts to elements of said n-channel MOSFETs while covering said p-contact openings;
   (k) etching said insulative layer thereby forming n-contact openings;
   (l) implanting n-type impurity ions into said n-contact openings;
   (m) stripping said second photoresist layer; said
   (n) forming conductive plugs in said n-contact openings and said p-contact openings.

7. The method of claim 6 wherein said insulative layer is a borophosphosilicate glass.

8. The method of claim 6 wherein said p-type impurity ions are $BF_2^+$ ions and are implanted at a dose of between about $2\times10^{14}$ and $2\times10^{15}$ ions/cm$^2$ and at an energy of between about 30 and 100 keV.

9. The method of claim 6 wherein said n-type impurity ions are phosphorous ions and are implanted at a dose of between about $2\times10^{14}$ and $2\times10^{15}$ ions/cm$^2$ and at an energy of between about 30 and 100 keV.

10. method of claim 6 wherein said conductive plugs are tungsten plugs.

11. A method for forming contacts in a CMOS integrated circuit comprising:
    (a) providing a silicon wafer having CMOS devices comprising p-channel MOSFETs and n-channel MOSFETS;
    (b) depositing an insulative layer over said CMOS devices;
    (c) planarizing said insulative layer;
    (d) depositing a first photoresist layer on said insulative layer;
    (e) patterning said first photoresist layer to define n-type contacts to elements of said n-channel MOSFETs;
    (f) etching said Insulative layer thereby forming n-contact openings;
    (g) implanting n-type impurity ions into said n-contact openings;
    (h) stripping said first photoresist layer;
    (i) depositing a second photoresist layer on said insulative layer;
    (j) patterning said second photoresist layer to define p-type contacts to elements of said n-channel MOSFETs while covering said p-contact openings;
    (k) etching said insulative layer thereby forming p-contact openings;
    (l) implanting p-type impurity ions into said p-contact openings;
    (m) stripping said second photoresist layer; and
    (n) forming conductive plugs in said n-contact openings and said p-contact openings.

12. The method of claim 11 wherein said insulative layer is a borophosphosilicate glass.

13. The method of claim 11 wherein said p-type impurity ions are $BF_2^+$ ions and are implanted at a dose of between about $2\times10^{14}$ and $2\times10^{15}$ ions/cm$^2$ and at an energy of between about 30 and 100 keV.

14. The method of claim 11 wherein said n-type impurity ions are phosphorous ions and are implanted at a dose of between about $2\times10^{14}$ and $2\times10^{15}$ ions/cm$^2$ and at an energy of between about 30 and 100 keV.

15. method of claim 11 wherein said conductive plugs are tungsten plugs.

* * * * *